(12) United States Patent
McFarland

(10) Patent No.: US 6,956,163 B2
(45) Date of Patent: *Oct. 18, 2005

(54) APPARATUS AND METHOD FOR PHOTOVOLTAIC ENERGY PRODUCTION BASED ON INTERNAL CHARGE EMISSION IN A SOLID-STATE HETEROSTRUCTURE

(75) Inventor: Eric W. McFarland, Santa Barbara, CA (US)

(73) Assignee: Adrena, Inc., Carpinteria, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/645,747

(22) Filed: Aug. 20, 2003

(65) Prior Publication Data

US 2005/0087224 A1 Apr. 28, 2005

Related U.S. Application Data

(63) Continuation of application No. 10/057,223, filed on Jan. 25, 2002, now Pat. No. 6,774,300.
(60) Provisional application No. 60/287,205, filed on Apr. 27, 2001.

(51) Int. Cl.[7] ............................................. H01L 31/04
(52) U.S. Cl. .................... 136/255; 136/256; 136/263; 136/252; 136/249; 257/40; 257/43; 257/437; 257/449; 257/461; 257/431; 257/453

(58) Field of Search ................. 136/225, 256, 136/263, 252, 249; 257/40, 43, 437, 449, 461, 431, 453

(56) References Cited

U.S. PATENT DOCUMENTS

| | | | | |
|---|---|---|---|---|
| 4,253,881 A | * | 3/1981 | Hezel | 136/256 |
| 4,342,044 A | * | 7/1982 | Ovshinsky et al. | 257/54 |
| 4,442,185 A | * | 4/1984 | Skotheim | 429/111 |
| 4,495,375 A | * | 1/1985 | Rickus et al. | 136/255 |
| 4,828,628 A | * | 5/1989 | Hezel et al. | 136/255 |
| 4,891,074 A | * | 1/1990 | Ovshinsky et al. | 136/249 |
| 4,891,325 A | * | 1/1990 | Hezel et al. | 438/4 |
| 5,413,739 A | * | 5/1995 | Coleman | 252/511 |
| 6,150,605 A | * | 11/2000 | Han | 136/255 |
| 6,774,300 B2 | * | 8/2004 | McFarland | 136/255 |

* cited by examiner

Primary Examiner—Alan Diamond
(74) Attorney, Agent, or Firm—Michael A. O'Neil

(57) ABSTRACT

An apparatus and method for solar energy production comprises a multi-layer solid-state structure including a photosensitive layer, a thin conductor, a charge separation layer, and a back ohmic conductor, wherein light absorption occurs in a photosensitive layer and the charge carriers produced thereby are transported through the thin conductor through the adjacent potential energy barrier. The open circuit voltage of the solar cell can be manipulated by choosing from among a wide selection of materials making up the thin conductor, the charge separation layer, and the back ohmic layer.

2 Claims, 18 Drawing Sheets

Figure 16: Surface Structures to increase absorption

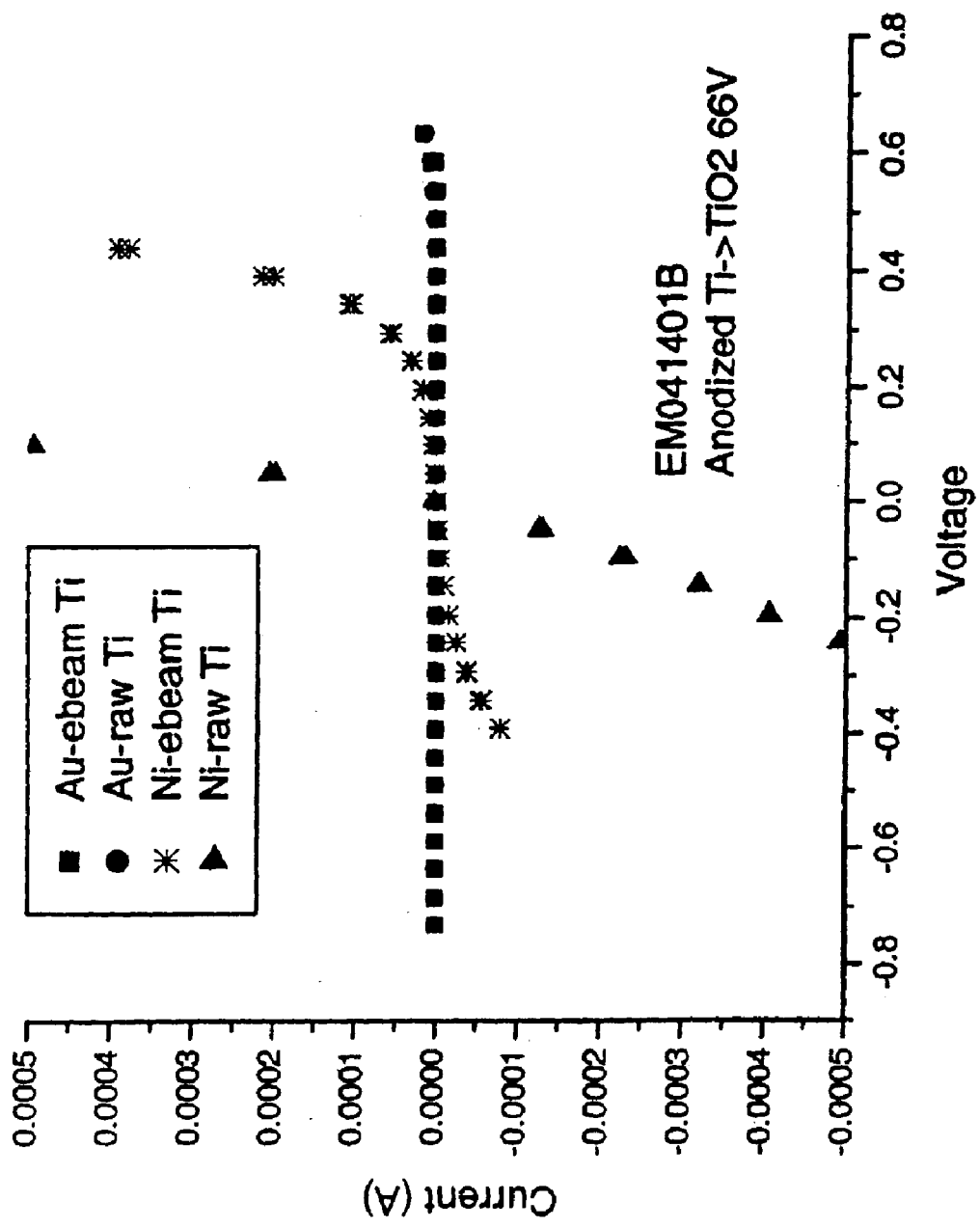
Figure 18: Current Voltage Plots of Device Using Au and Ni ultra-thin conducting layers

APPARATUS AND METHOD FOR PHOTOVOLTAIC ENERGY PRODUCTION BASED ON INTERNAL CHARGE EMISSION IN A SOLID-STATE HETEROSTRUCTURE

This application is a Continuation Application of U.S. patent application Ser. No. 10/057,223, filed Jan. 25, 2002, now U.S. Pat. No. 6,774,300, which claims the benefit of U.S. Provisional Patent Application No. 60/287,205, filed Apr. 27, 2001.

TECHNICAL FIELD

The present invention is directed to low cost, high efficiency solar cell technology. More specifically, the present invention is related to a method and apparatus for producing photovoltaic energy using solid-state devices.

BACKGROUND OF THE INVENTION

Conventional photovoltaic cells convert sunlight directly into electricity by the interaction of photons and electrons within the semiconductor material. Most solid-state photovoltaic devices rely on light energy conversion to excite charge carriers (electrons and holes) within a semiconductor material and charge separation by a semiconductor junction producing a potential energy barrier. To create a typical photovoltaic cell, a material such as silicon is doped with atoms from an element with one more or less electrons than occurs in its matching substrate (e.g., silicon). A thin layer of each material is joined to form a junction. Photons, striking the cell, transfer their energy to an excited electron hole pair that obtains potential energy. The junction promotes separation of the electrons from the holes thereby preventing recombinations thereof. Through a grid of physical connections, the electrons are collected and caused to flow as a current. Various currents and voltages can be supplied through series and parallel arrays of cells. The DC current produced depends on the electronic properties of the materials involved and the intensity of the solar radiation incident on the cell.

Conventional solar cell technologies are based largely on single crystal, polycrystalline, or amorphous silicon. The source for single crystal silicon is highly purified and sliced into wafers from single-crystal ingots or is grown as thin crystalline sheets or ribbons. Polycrystalline cells are another alternative which is inherently less efficient than single crystal solar cells, but also cheaper to produce. Gallium arsenide cells are among the most efficient solar cells available today, with many other advantages, however they are also expensive to manufacture.

In all cases of conventional solid-state photovoltaic cells, photon (light) absorption occurs in the semiconductor with both majority and minority charge carriers transported within the semiconductor; thus, both electron and hole transport must be allowed and the band gap must be sufficiently narrow to capture a large part of the visible spectrum yet wide enough to provide a practical cell voltage. For the solar spectrum the ideal band gap has been calculated to be approximately 1.5 eV. Conventionally, expensive material and device structures are required to achieve cells that provide both high efficiency and low recombination probability and leakage.

A conventional solid-state solar cell, such as the one shown in FIG. 1, may include structures such as a semiconductor junction, heterojunction, interface, and thin-film PV's, which may be made from organic or inorganic materials. In all of these devices the necessary elements of these types of devices are a) photon absorption in the semiconductor bulk, b) majority and minority charge carrier transport in the semiconductor bulk, c) a semiconductor band-gap chosen for optimal absorption of the light spectrum and large photovoltages, and d) ideal efficiency limited by open circuit voltages less than the semiconductor band-gap. The photon absorption occurs within the bulk semiconductor and both majority and minority carriers are generated and transported in the bulk. For adequate absorbency, relatively thick, high quality semiconductors are needed. However, defect free, thick, narrow band-gap, materials are limited in numbers and expensive to fabricate. In heterostructures a limited number of acceptable compatible materials are available. Schottky barrier based devices have been proposed in this class that rely, again, on absorption of photons in the semiconductor bulk and use the Schottky barrier for charge separation.

Another class of conventional solar cells are the dye-sensitized photoelectrochemical solar cells as shown in FIG. 2. These devices were derived from work on photoelectrochemical electron transfer and are cathode/electrolyte/anode systems in which a photoactive molecule is light activated and oxidized (or reduced)by electron (or hole) transfer to the adjacent semiconductor electrode. The charge transfer agents which replace the transferred charge in the photoactive molecule are typically molecules or atoms dissolved in a liquid electrolyte such that the molecules or atoms receive charges from an electrode. Reduction is performed by an electron donor in the liquid electrolyte. This device is limited in its power output by the relative free energies of electrons in the electrolyte and the semiconductor which limit the photovoltage. The maximum photovoltage is limited by the difference between the bottom of the conduction band edge and the liquid electrolyte chemical potential. Additional inefficiencies result from the required molecular diffusion of the donors to the electrode as well as overpotential losses at the electrode/electrolyte interface.

Another solid-state solar cell is the dye-sensitized Schottky barrier solar cell as described in U.S. Pat. Nos. 4,105,470 and 4,190,950 by Dr. Skotheim. The Skotheim device is similar to the above-mentioned photoelectrochemical cell except the liquid electrolyte is replaced by a "reducing agent" layer, the property of which is not precisely identified in either the '470 nor the '950 patent. Purportedly, as a means of removing the band-gap restrictions of conventional PV's, an invention was reported by Skotheim who proposed a solid-state Schottky barrier device whereby a) photon absorption occurs in a photosensitive dye deposited on the surface of a semiconductor, b) majority charge carriers are injected directly into the conducting bands of the adjacent semiconductor, c) the ionized photosensitizer is neutralized by charges delivered by a reducing agent, d) a conductor provides charge to the reducing agent, and e) the Schottky barrier height will determine the device's ideal efficiency and its height is determined by the interaction of the dye and the semiconductor. However, as previously mentioned, neither patent suggests the physical properties of the reducing agent, and it is unclear whether the proposed devices disclosed in the '470 and '950 patents can indeed yield the purported results. In the proposed cell three separate molecular oxidation/reduction electron transfer steps are required (one from the excited dye to the adjacent semiconductor, one from the reducing agent to the dye, and one from the conductor to the reducing agent) Thus an electron must move from/to a conduction band to/from a molecular orbit twice and from one molecular orbit to another one. An implementation of the device was published using an organic hole transport material, however, the performance and longevity were poor [ref: U. Bach, et al., Nature, Vol. 395, October 1998, pg. 583–5851].

Experimental work by the present inventor has demonstrated that low energy molecular energy transfer at conducting surfaces can lead to excited charge carriers that can be efficiently transported through a conductor without energy loss (via ballistic transport) and captured by an electrical barrier device wherein the barrier height is determined in part by the electronic interactions between the surface conductor and the barrier material.

Accordingly, a fundamentally different type of photovoltaic device is provided by the present invention which can be easily manufactured from a wide variety of inexpensive material, and which may be, in practice, more efficient, the various embodiments of which will be described in more detail below.

SUMMARY OF THE INVENTION

The preferred embodiment of the present invention described herein is a multilayer solid-state structure wherein light absorption occurs in photosensitive layer (molecules or nanostructures) and the energetic charge carriers produced by the absorption are transported ballistically, without significant energy loss, through an ultra-thin conductor, to and over an adjacent potential energy barrier that separates and stores the charge for use as electrical power. The potential energy barrier largely determines the device efficiency and can be optimized by choice of the device materials.

In accordance with the preferred embodiment, a photoexcitable molecular species or absorbing nanostructure is deposited on an ultra-thin conductor, and following photoexcitation excited charges are ballistically transported through the conductor to the potential energy barrier (Schottky barrier) created at the interface between the conductor and the charge collection layer (a semiconductor). The ultra-thin conductor has, inter alia, three specific functions: I) allows efficient ballistic transport of charge carriers from the photosensitizer to the potential barrier at the interface, II) directly provides replacement charges of the opposite sign to the ionized photosensitizer, and III) influenced, in part, by its interaction with the charge separation layer, the magnitude of the potential energy barrier which determines, in part, the maximum device power.

The essential components (e.g., layers) of the preferred embodiment of the present invention include: 1) a photosensitive layer where light energy is converted to electron and/or hole excitation, 2) an adjacent ultra-thin conducting layer that provides a pathway for ballistic transport of charges using high efficiency conduction bands, and as a source of replacement charges to the photosensitive layer; and 3) a charge separation and collection layer such as an inorganic or organic semiconductor affixed with a back side ohmic contact opposite the ultra-thin conducting layer. The ohmic contact collects the charges transported across the barrier. The addition of an anti-reflection coating on top of the device is a highly practical embodiment of the invention.

The present invention is advantageous over the aforementioned dye-sensitized Schottky barrier solar cell structure in that it has the advantage of potentially greater photovoltages due to the ability to influence the barrier height by the choice of a high (for n-type semiconductors) or low (for p-type semiconductors) work function conductors at the surface, by the choice of the semiconductor (type and doping level), and by the surface treatment of the semiconductor prior to disposition of the conductor to maximize the barrier height by affecting the interface. Additional advantages of the present invention include eliminating the need for a specific reducing agent or a minority charge carrier transport material, and providing the ability to choose from among a broad choice of charge separation layer material to include both wide band-gap n and p type semiconductors. In contrast to the prior art U.S. Pat. Nos. 4,105,470 and 4,190,950 by Skotheim, only two transfers of electrons to/from conduction bands are required and no intermolecular charge transfer is necessarily required.

It is an object of the present invention to: 1) eliminate the need for electrolytes and/or molecular reducing agents and/or minority carrier conductors, 2) allow for a wider choice of the conductor and charge separation layer, and 3) maximize by design of the open circuit photovoltage.

It is another object of the present invention to increase the efficiency of photovoltaic energy generation. More specifically, light absorption can be optimized since a single band-gap is not required for light absorption and a large number and variety of materials with selectable spectral properties of photoabsorbing molecules or structures can be utilized without the need for compatibility with an electrolyte. Without the overpotential losses of the electrochemical redox reactions (both at the electrodes in the photoelectrochemical cell and by the reducing agent charge transfer), higher efficiencies are also possible. The ultra-thin conductor is used as an efficient ballistic transport channel and to maximize the photovoltage as determined by its effect on the barrier. The interaction between the conductor and charge separation layer to influence the barrier height, can be optimized by the choice of the conductor, charge separation material, and interface preparation.

It is yet another object of the present invention to lower the cost of generating photovoltaic energy. More specifically, present solid-state P.V. systems are expensive due to the need for high purity low defect silicon or other semiconductors with the required band-gap, which have high manufacturing costs. The liquid containing photoelectrochemical cells have reliability and efficiency limits as well as restrictions on the dye stability and reducing agent in solution, thus increasing their in-use costs. Frequently, reactive species such as iodine must be used.

In is yet another object of the present invention to increase the longevity of the solar cell devices by using stable components. In the case of photoelectrochemical cells, most types of feasible electrolytes are reactive and can erode or dissolve the adjacent semiconductor or react with the dye, causing the device to be unstable. By eliminating the need to use components, the present invention promotes the longevity of solar cells.

BRIEF DESCRIPTION OF THE DRAWINGS

A more complete understanding of the present invention may be had by reference to the following Detailed Description when taken in connection with the accompanying Drawings, wherein:

FIG. 18 is a current versus voltage plot of a device made in accordance with the preferred embodiment of the present invention.

DETAILED DESCRIPTION

Various embodiments of the present invention will be described with reference to FIGS. 3–11. Although only a limited number of embodiments of the invention are described hereinafter, it shall be understood that the detailed discussion of the embodiments is not intended to limit the present invention to those particular embodiments.

Figure 1:
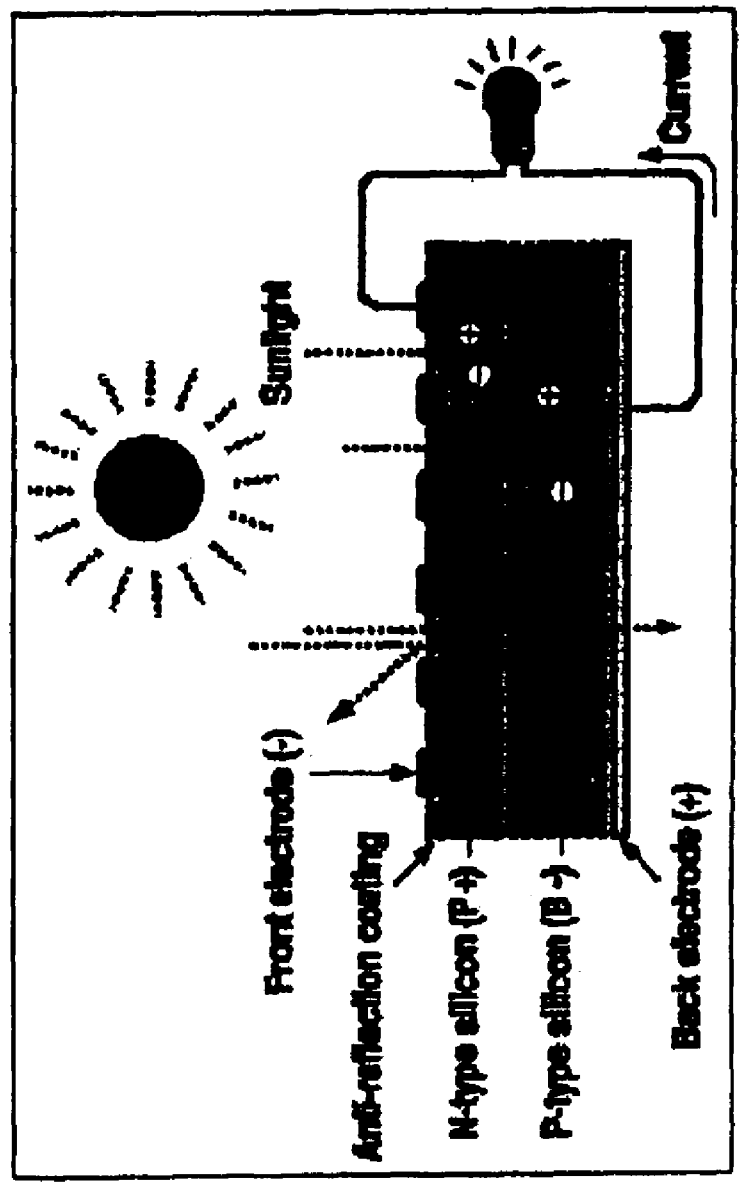
FIG. 1 is a graphic illustration of a conventional solid-state solar cell.
Figure 2:
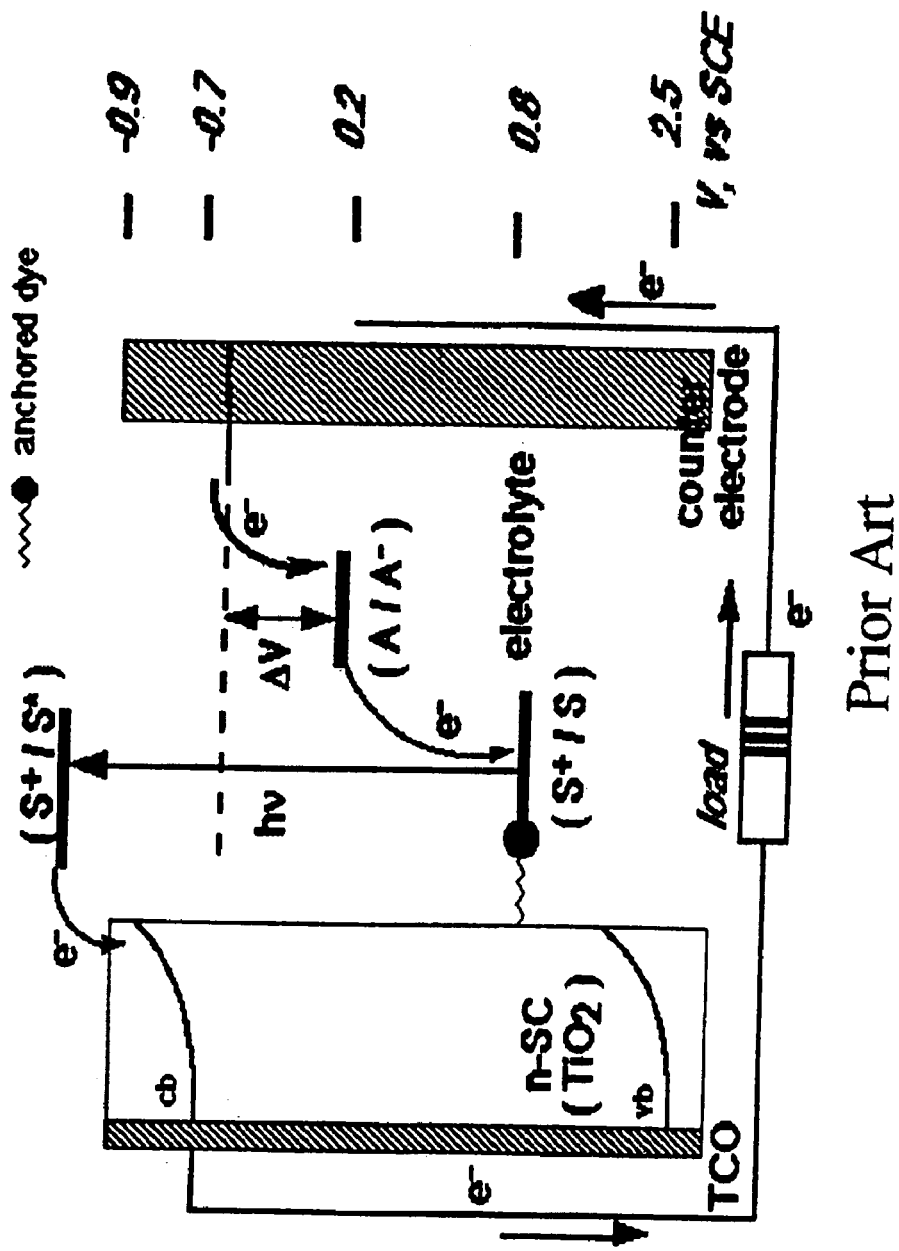
FIG. 2 is an illustration of a conventional dyesensitized photoelectrochemical cell.
Figure 3:
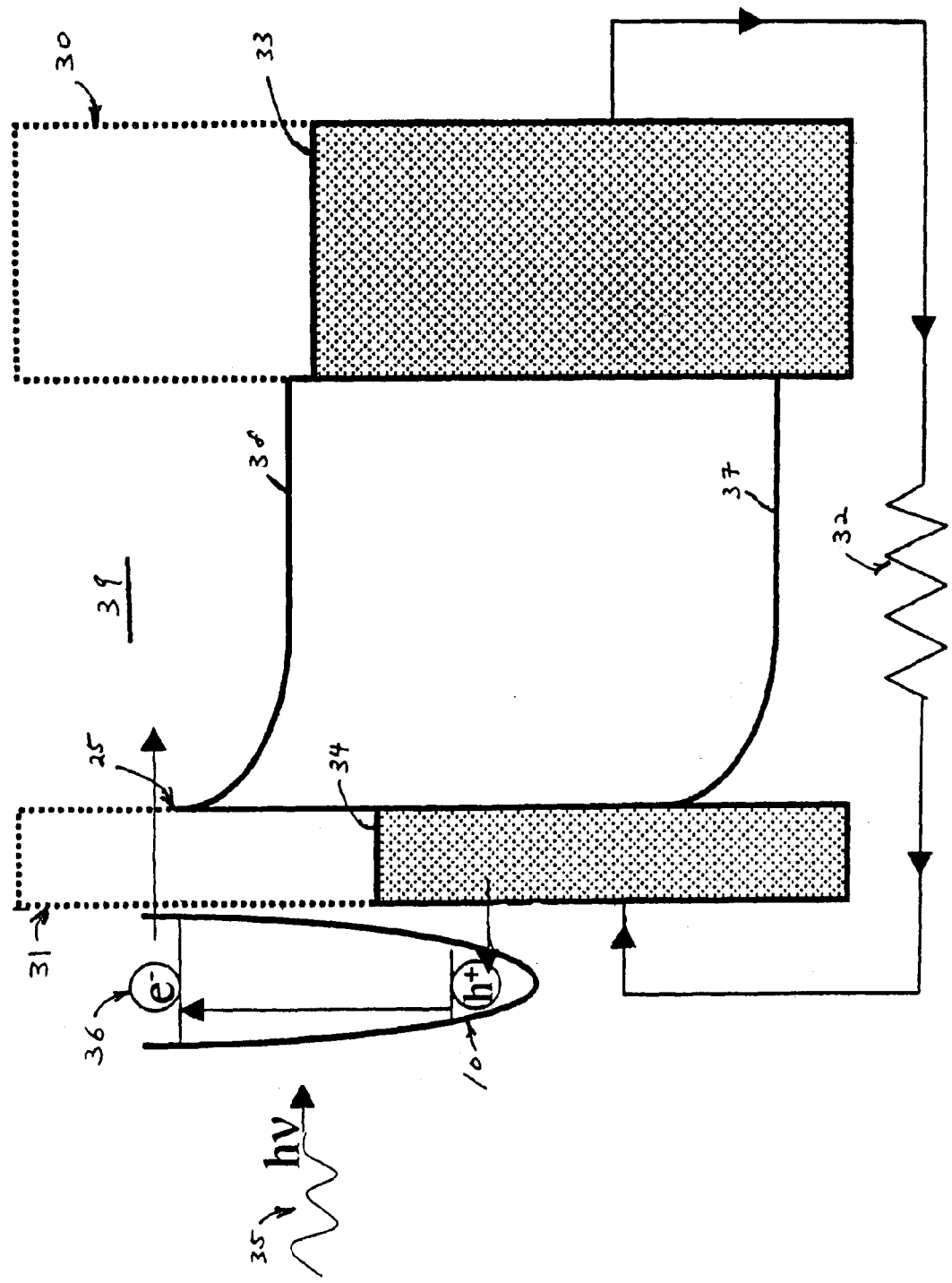
FIG. 3 is an illustration of the present invention in accordance with the preferred embodiment.
Figure 14:
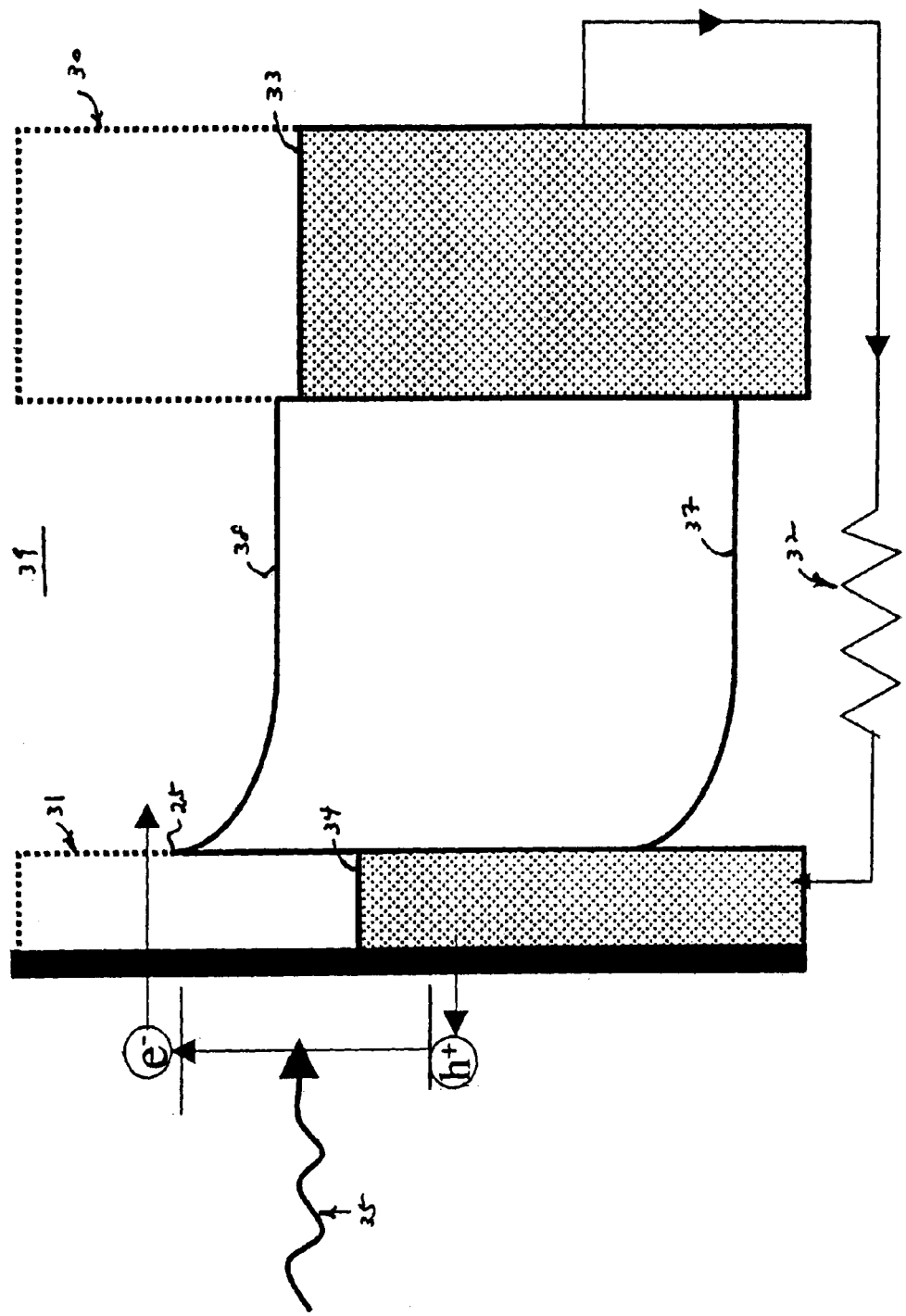
FIG. 14 is an illustration of the present invention in accordance with yet another alternative embodiment.
Figure 16:
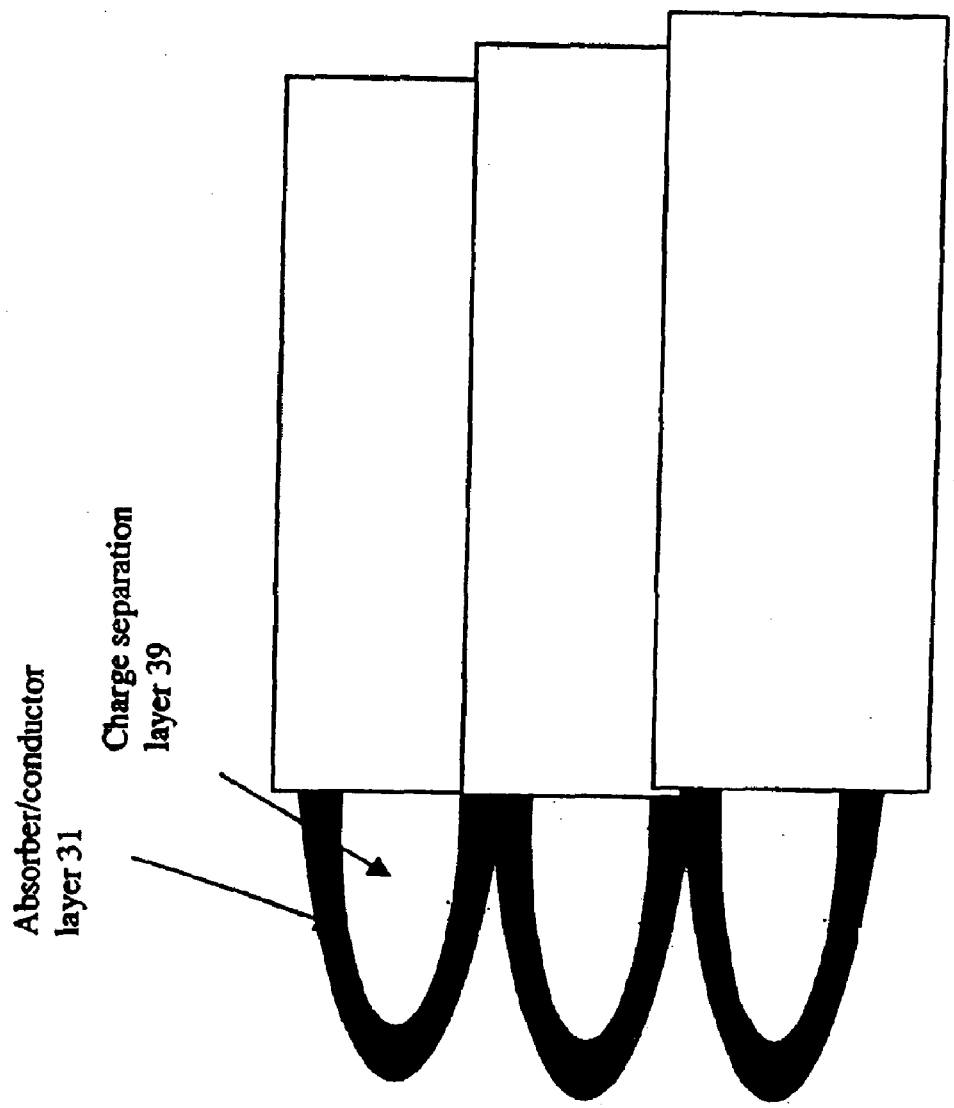
FIG. 16 is an illustration of the present invention in accordance with yet another alternative embodiment.

FIG. 3 illustrates a photosensitized solid-state device in accordance with the preferred embodiment of the present invention. More specifically, the photosensitized solid-state device includes a photosensitive layer 10, a front conducting layer 31, a charge separation layer 39, a back conducting layer 30, and a load 32. The front conducting layer 31 is preferably an ultra-thin metal film (preferably in the nanometer range), while the back conducting layer 30 is preferably an ohmic conducting layer. The charge separation layer 39 has a determinable conduction band energy level 38 and a determinable valence band energy level 37. In an alternative embodiment as shown in FIG. 14, the metal film may be chemically treated to: 1) allow improved bonding of the photoactive materials, and 2) provide partial isolation of the photoreceptor from the conductor to optimize ballistic charge transfer compared to other pathways to de-excitation of the excited photoreceptor. In another alternative embodiment as shown in FIG. 16, the surface of the device consisting of the photosensitive layer/metal film/charge separation layer is highly contoured, porous, or otherwise shaped to maximize the surface area and maximize the absorbance of photons.

The front conducting layer 31 and the back conducting layer 30 preferably have determinable work function levels 34 and 33, respectively. It is preferable that the material chosen to make up the front conducting layer 31 has a higher work function (more negative) than the Fermi level of the charge separation layer 39 if the charge separation layer 39 is of an n-type semiconductor, or if the charge separation layer 39 is of a p-type semiconductor, a lower work function to facilitate formation of a Schottky barrier 25.

It is preferable that the front conducting layer 31 is of the type of material that forms a Schottky barrier with the charge separation layer 39 so as to maximize the power output of the solid-state device. Such material (for an n-type barrier) may include metals such as gold or platinum, or a non-metal material such as organic conductor polythiophene or a metal oxide. For a p-type barrier, such as one shown in FIG. 8, materials include low work function conductors including aluminum and titanium. In accordance with the preferred embodiment, the front conducting layer 31 acts as a donor to the photo-oxidized surface species and thereby eliminates the need for a redox active electrolyte, which causes losses in the production of photovoltaic energy and typically has mass transport limitations for current flow.

Figure 17:
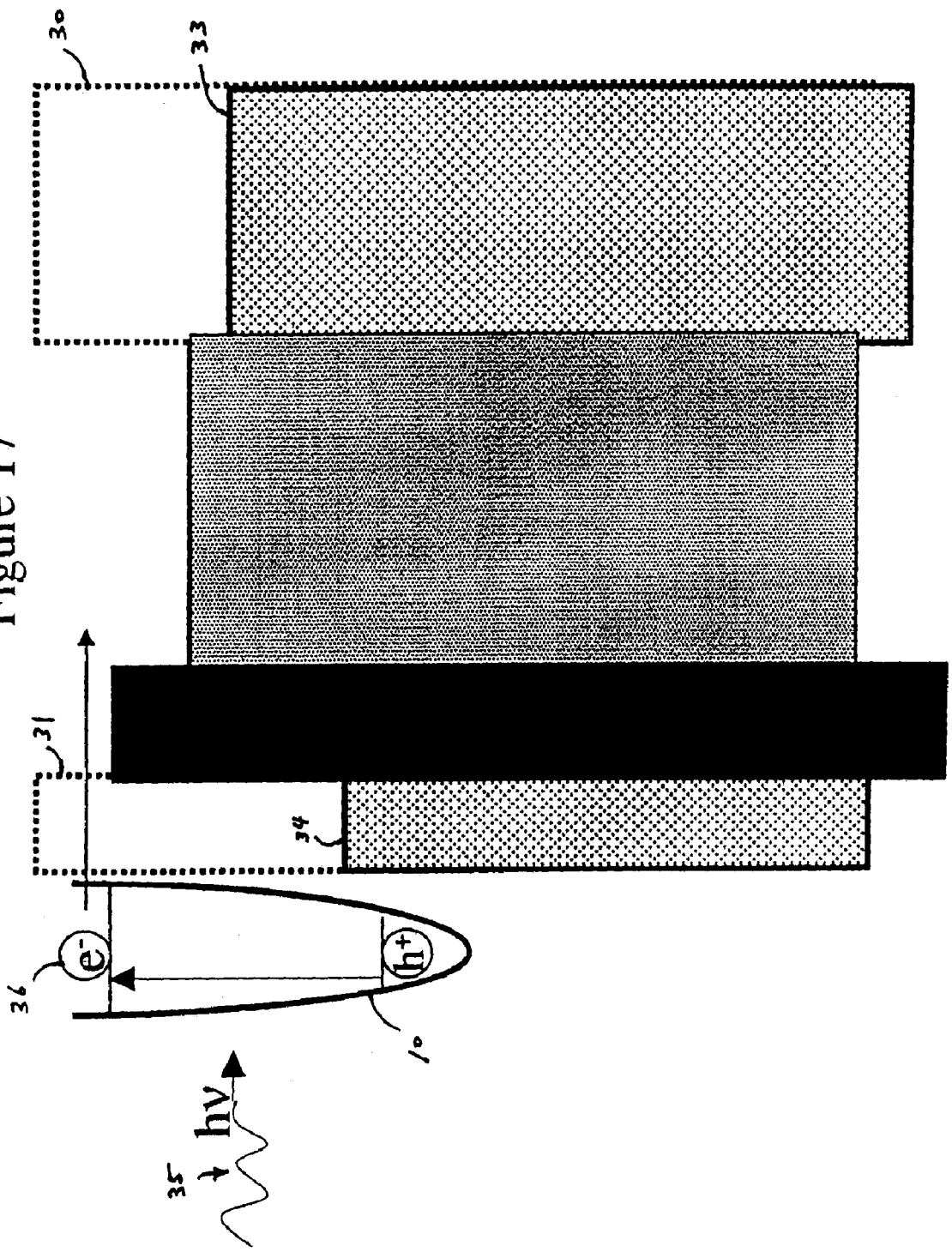
FIG. 17 is an illustration of the present invention in accordance with yet another alternative embodiment.

The charge separation layer 39 is preferably made of a semiconductor material, or multiple semiconductors. Either inorganic semiconductor materials (e.g., titanium dioxide, zinc oxide, other metal and mixed metal oxides, moly sulfide, zinc sulfide, other metal and mixed metal sulfides, silicon carbide, etc.) or organic semiconductor materials, either hole conducting (e.g., triphenyldiamine (TPD), poly (p-phenylene vinylene) (PPV), poly (vinyl carbazole) (PVC), and their derivatives, etc.), or electron conducting (e.g., conjugated oligothiophenes, oxadiazole derivatives, etc.) may be used. In an alternative embodiment as shown in FIG. 17, the charge separation layer 39 is made of an insulator or insulator-semiconductor composite structure with the key feature being alignment of the majority carrier bands with the absorber donor level (in FIG. 3, 36 for n-type or in FIG. 8, 84 for p-type). The photosensitizer layer 10 can be a dye or any energy absorbing material or structure, and may include light absorbing atomic or molecular species on a surface (e.g., cis-di(thiocyanato)-N, N-bis-(2,2-bipyridyl-4,4-dicarboxylic acid)-Ru(II), phthalocyanines, carbocyanines, merbromin, 9-phenylxanthene, iron cyanate, etc.), or quantum structures (e.g., nanoparticles of CdS, CdSe, or other semiconductors, or metals, or nanolayers of absorbing material). Additionally, multiple types and/or layers of different photoactive species can be used on the photosensitizer layer 10 to maximize the spectrum capture of incident light. In an alternative embodiment, the photoactive species may be imbedded in the front conductive layer to make a single composite layer.

In fabricating the above-described structure, the photosensitizer layer, the front and back conducting layers, and the charge separation layer can be deposited by vapor deposition, electrochemical deposition, deposition from solution or colloidal suspension, or be produced by evaporative, extrusion, or other conventional polymer manufacturing techniques. With specific regard to the charge separation layer 39, it may be created with high surface area using organic template molecules, or it can be nano-, meso-, or macro-porous to increase the surface area. The conductor and photoactive layers would then follow the contoured surface (see FIG. 16).

In a specific fabrication example comprising the preferred embodiment of the invention, a charge separation layer 39 of titanium dioxide is deposited onto titanium foil (the ohmic back contact 30). The charge separation layer 39 has a thickness ranging between 100 nm and 500 nm and is deposited by electron beam evaporation and/or by electroanodization of the titanium metal. Gold is then deposited to the composite layer to a thickness of 10 nm to form the ultra-thin conductor.

The operation of the preferred embodiment will now be discussed with reference to FIG. 3. The preferred embodiment of FIG. 3 produces electrical power from a photon energy source based on light energy conversion to charge excitation in a layer containing photosensitive molecules or structures. More specifically, a photon energy source 35 with energy hv, such as sunlight, is incident upon the photosensitive layer 10. The energy source excites electrons 36 located in the photosensitive layer 10 causing the electrons 36 to rise to a higher energy state. In accordance with the preferred embodiment, electrons having an energy level above the barrier height 25 (or slightly below if tunneling occurs) pass through the front conducting layer 31 via ballistic transport (ballistic transport refers to the transfer of electrons through a medium in which there is a low or zero scattering cross-section between the electrons and the medium through which they are transferred). The process of charge (electron) emission from the photoexcited absorber into and ballistically across the conduction bands of the conductor and charge separation layer is termed "Internal Charge Emission".

Once the electrons travel through the front conducting layer 31, they travel through the charge separation layer 39 towards the back ohmic conducting layer 30 where they are stored with photon derived excess potential energy for later use (dissipation) in passing through the load 32. After losing their energy in the load 32 the electrons are returned to the front conducting layer 31. The maximum photovoltage of the device, or open circuit voltage, is determined by the potential barrier height between the front conducting layer 31 and the charge separation layer 39. In conventional Schottky solar cells (where the photons are absorbed in the semiconductor band-gap) the same maximum voltage is possible as determined by the barrier height, however, in the present invention the choice of semiconductors is not limited to those with solar spectrum absorbance. The voltage can be optimized or influenced by selecting appropriate materials for the front conducting layer 31 and the charge separation layer 39, and by specific treatments of the interface. For example, on clean silicon the Schottky barrier varies from approximately 0.4 eV to 0.8 eV as the conductor work function increases from approximately −2.5 eV (Ca) to −5.0 eV (Au) and on GaAs from 0.6 eV (for Mg) to 1 eV (for Pt). Preparation of the interface and metal can also be used to increase the barrier for Pd on titanium dioxide where treatment of the metallic conductor Pd with oxygen causes an increase in the barrier of nearly 0.5 eV. The design approach is to maximize the barrier and still allow efficient carrier transport across the barrier and efficient replacement of photosensitizer (PS) charge by the conductor.

In accordance with an alternative embodiment, the charge separation layer 39 may be a thin insulating layer (PS-MIM configuration) wherein the conduction band edge and thickness of the insulator are chosen to allow charge carriers from the photoexcited state of the photosensitizer 10 to move to the back contact and prevent current flow in the opposite direction.

In accordance with another alternative embodiment of the present invention an additional layer of semiconductor is included between the charge separation layer 39 and the back metal contact (PS-MIS configuration). The conduction band edge and thickness of the charge separation layer and the semiconductor type are chosen to allow charge carriers from the photoexcited state of the photosensitizer to move to the back contact and prevent current flow in the opposite direction.

Figure 4:
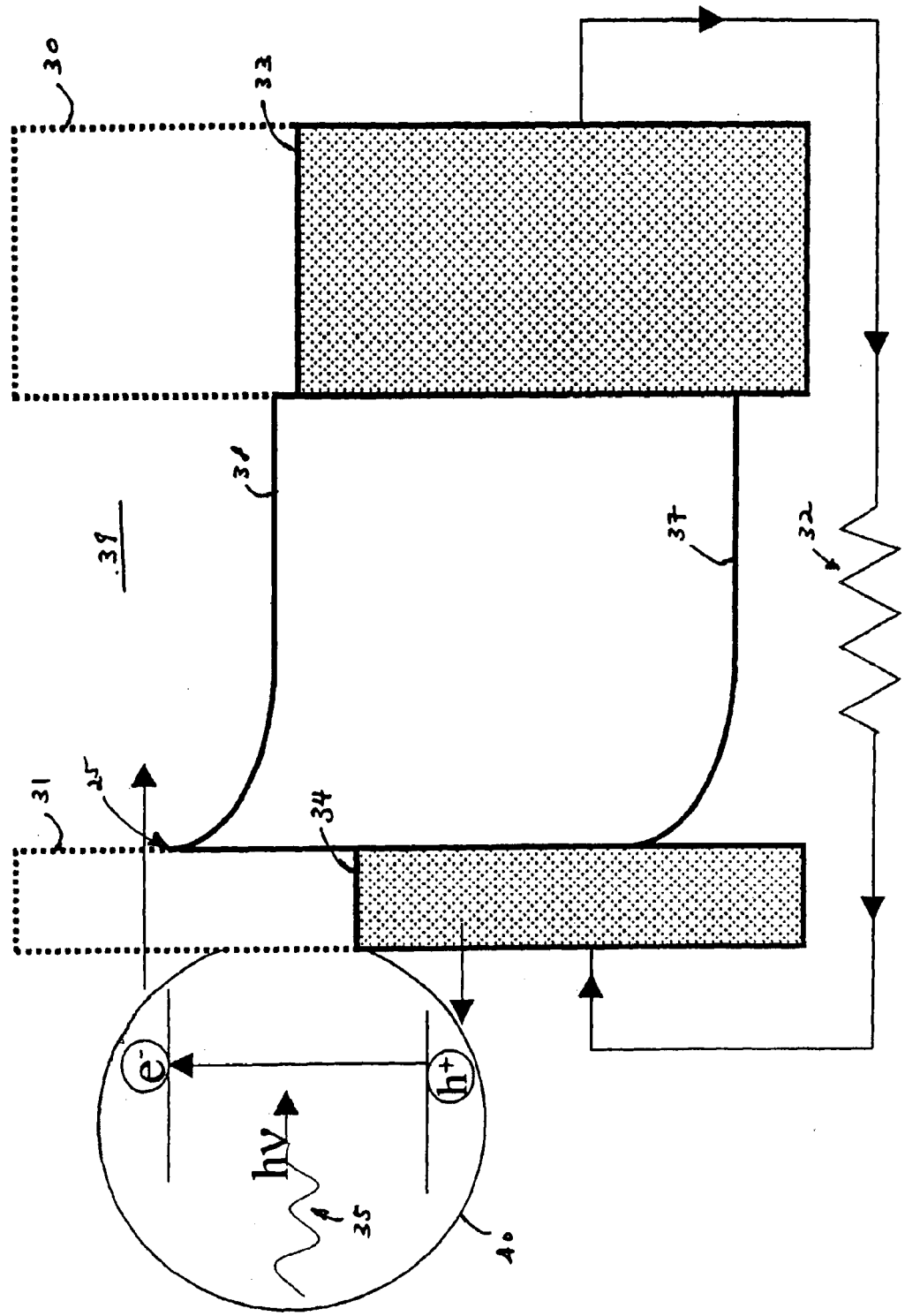
FIG. 4 is an illustration of the present invention in accordance with an alternative embodiment.

In accordance with another alternative embodiment as shown in FIG. 4, the photosensitizer layer 10 is replaced with a layer of photoactive material 40 comprising of clusters of atoms or molecules, including doped or quantum structures (quantum wells, nanoparticles, quantum dots, etc.), with dimensions engineered to maximize light absorbency and ballistic electron transfer. One advantage of this alternative embodiment is that the charged electrons transferred need not move into or out of an atomic or molecular system, which is the case when using a photosensitive dye. Rather, the electrons travel in and out of degenerate levels with less hindrance due to quantum state restrictions. A specific example would be the deposition of CdSe or CdS nanoparticles (~5 nm in dimension) on the conductor surface. These semiconductor particles have been shown to have efficient capture and efficient transfer to semiconductors. Interposing the conductor ballistic transport will still allow charge transfer; however, the particle can now be supplied with compensation charge directly from the conductor.

Figure 5:
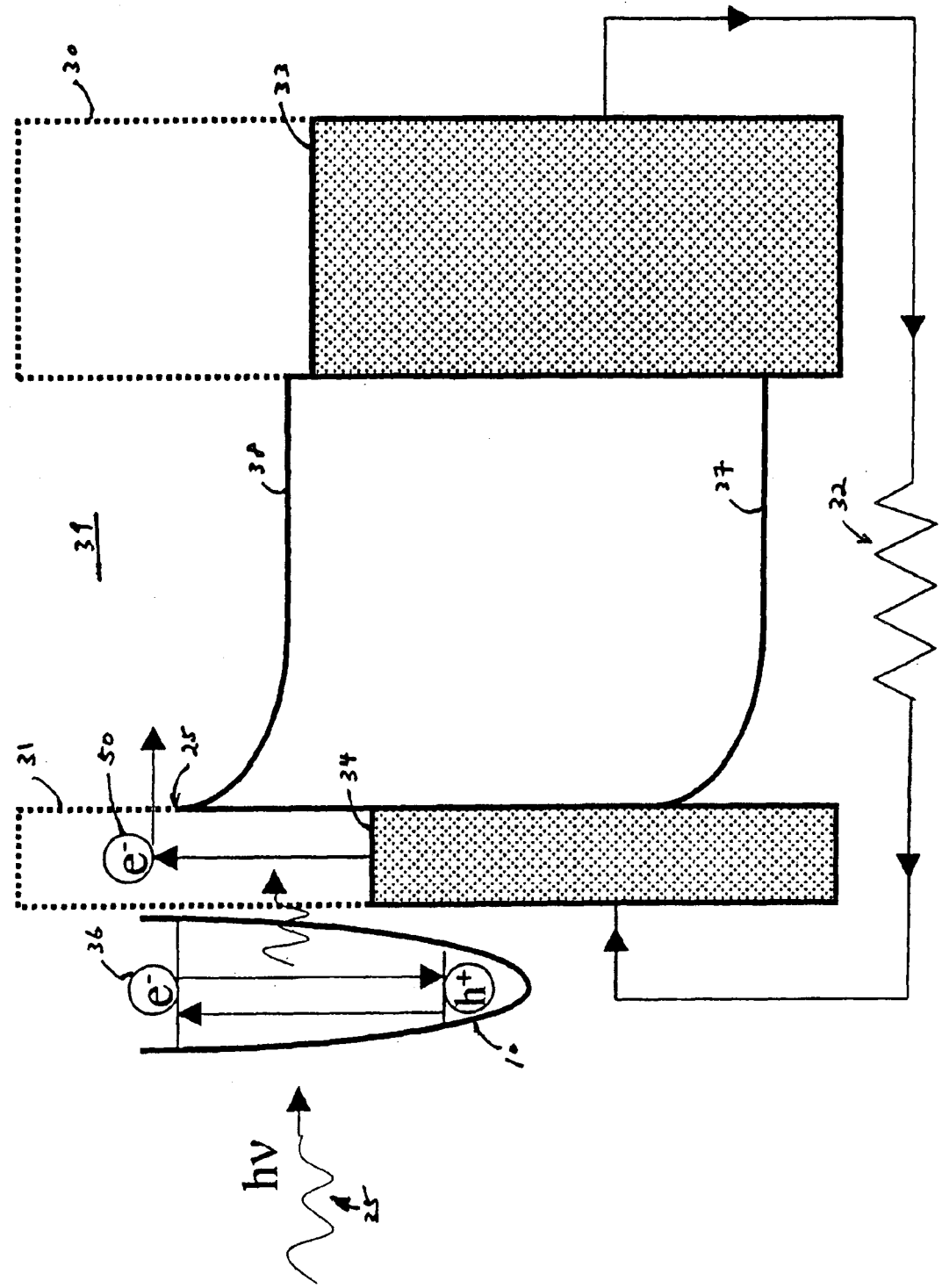
FIG. 5 is an illustration of the present invention in accordance with another alternative embodiment.

In accordance with another alternative embodiment of the present invention as shown in FIG. 5, the electrons 36 of the photosensitizer layer 10 do not ballistically transport through the front conducting layer 31. Rather, as the excited electrons 36 relax back to lower energy states, energy released from electrons 36 excites electrons 50 that reside in the front conducting layer 31. The excited electrons 50 may thereafter rise above the conduction energy band 38 and flow towards the back conducting layer 30.

Figure 6:
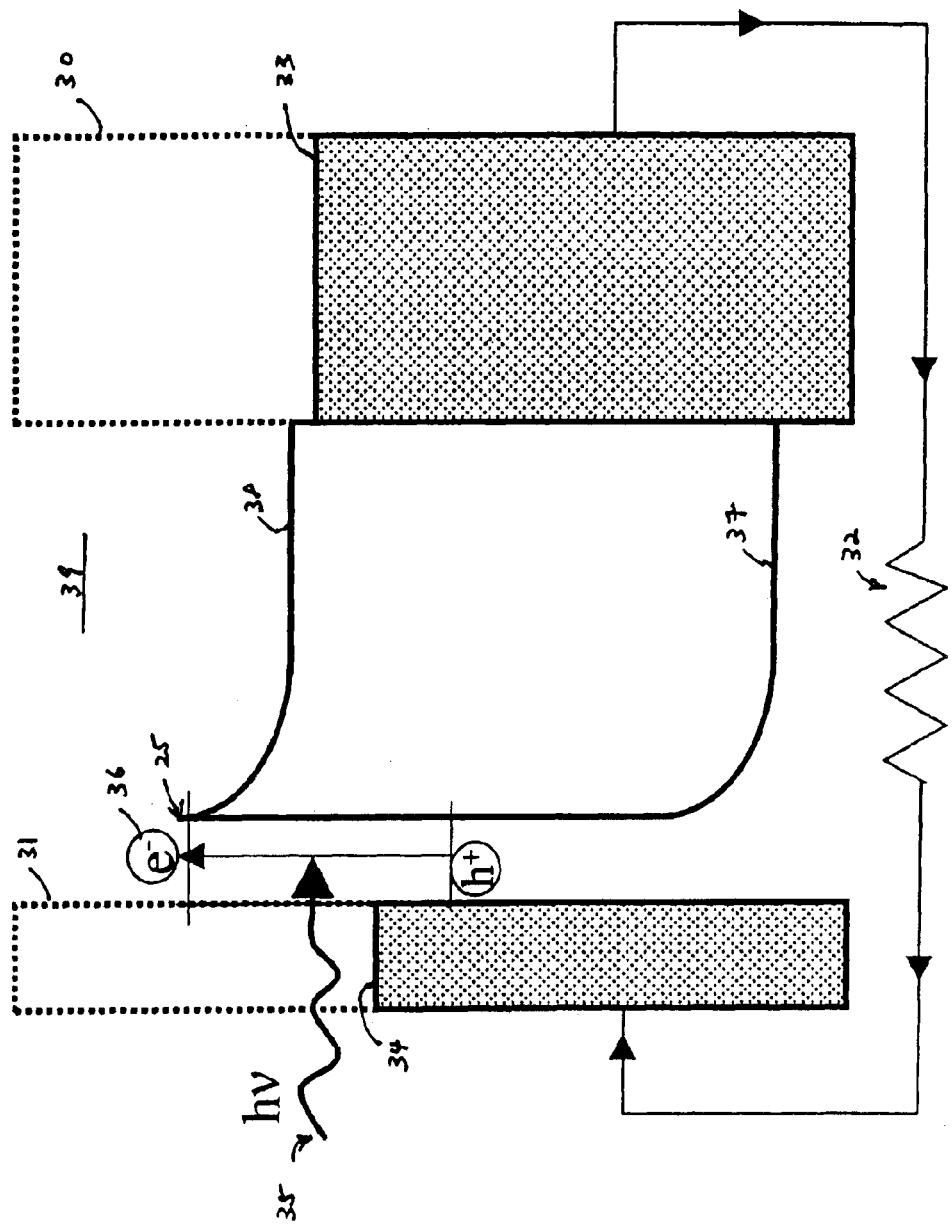
FIG. 6 is an illustration of the present invention in accordance with yet another alternative embodiment.

In yet another alternative embodiment as shown in FIG. 6, the front conducting layer 31 is selected from among either conductors that have transparency characteristics, such as indium tin oxide, or semi-transparent conductors (e.g., ultra-thin metal). In this embodiment the photosensitizer layer can be deposited between the front conducting layer 31 and the charge separation layer 39, thereby eliminating the need for ballistic transport of the electrons 36, while still maintaining the tenability of the barrier height.

Figure 7:
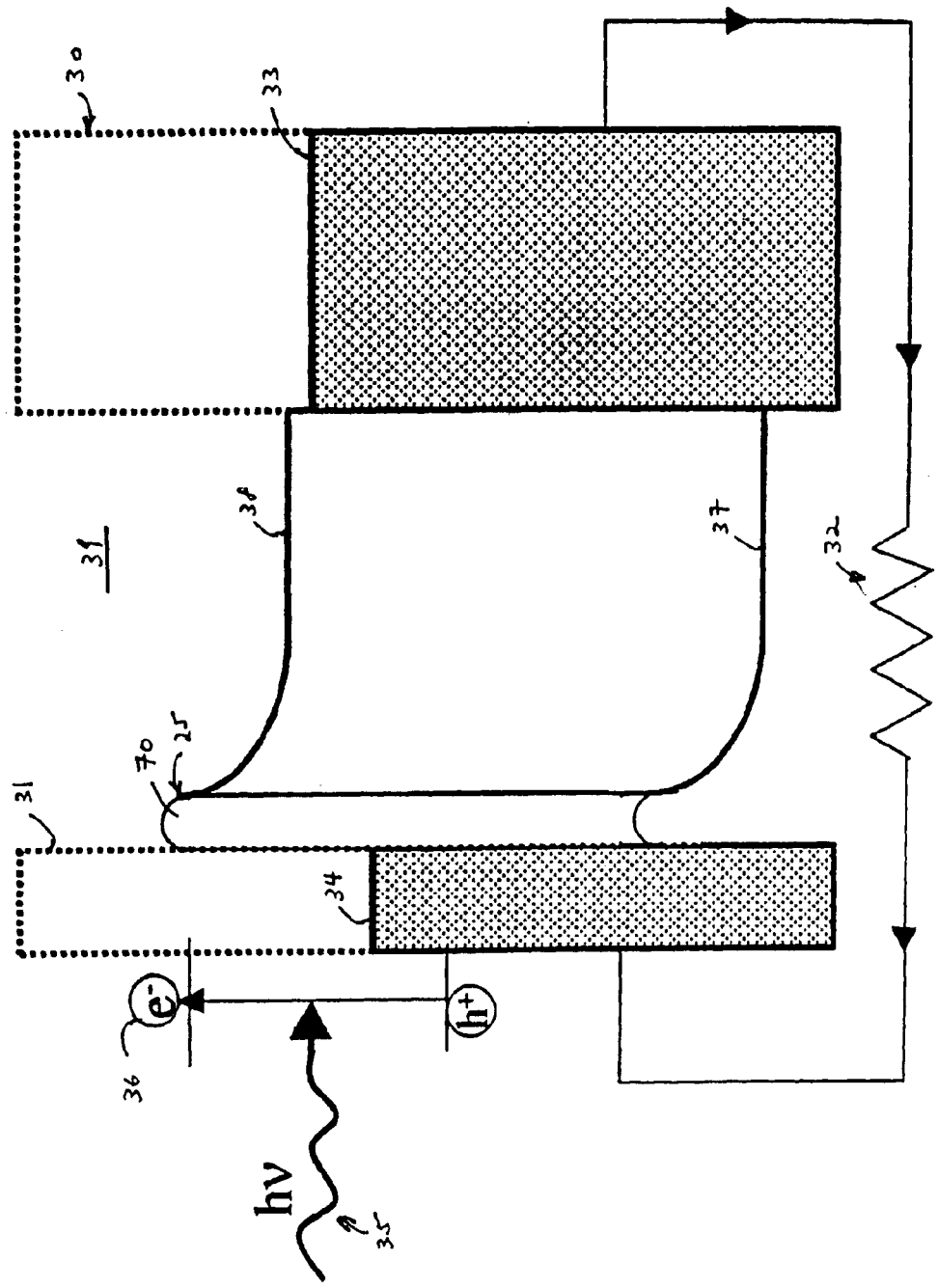
FIG. 7 is an illustration of the present invention in accordance with yet another alternative embodiment.

In accordance with another alternative embodiment of the present invention as shown in FIG. 7, a doped semiconducting layer 70 having a doping type opposite that of the charge separation layer 39 is placed between the front conducting layer 31 and the charge separation layer 39. This particular embodiment effectively increases the Schottky barrier level and thus the open circuit voltage of the photovoltaic device as has been demonstrated in conventional Schottky Barrier Solar Cells.

Figure 8:
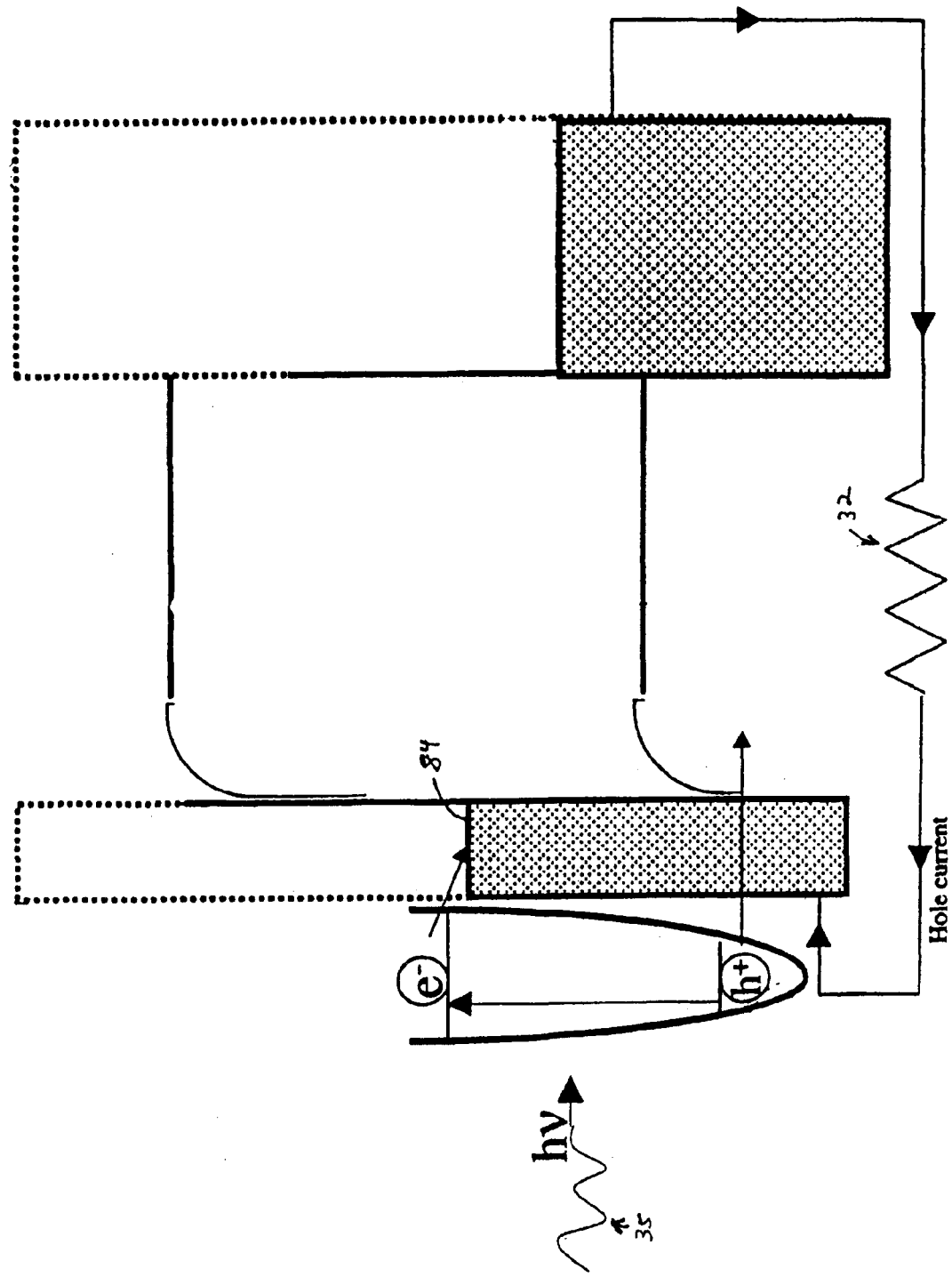
FIG. 8 is an illustration of the present invention in accordance with yet another alternative embodiment.

FIG. 8 shows yet another alternative embodiment of the present invention wherein the charge carriers are ballistic holes rather than electrons. The above-described operating principles of the preferred embodiment (shown in FIG. 3) are symmetrically applied in this instance.

Figure 9:
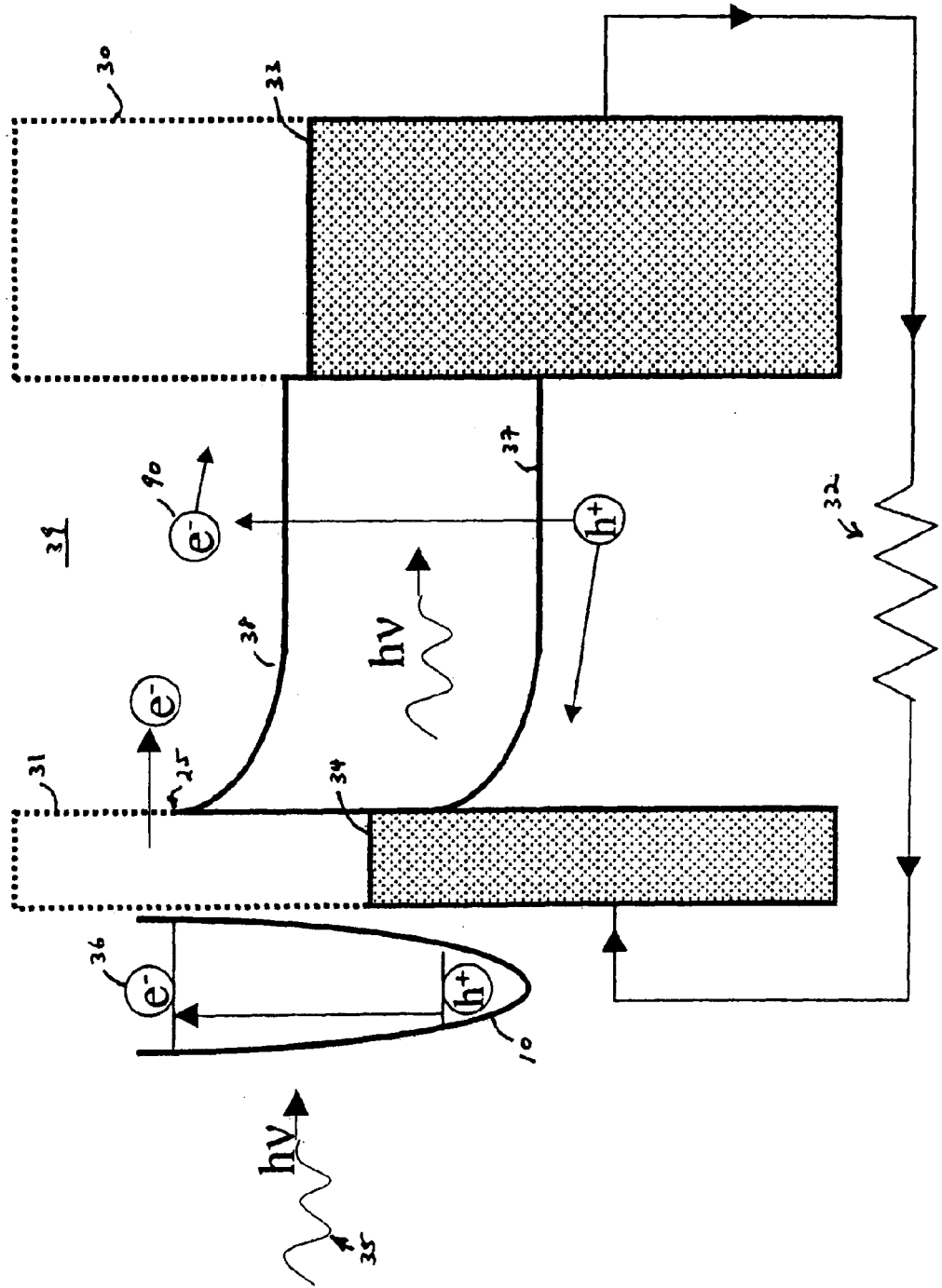
FIG. 9 is an illustration of the present invention in accordance with yet another alternative embodiment.

FIG. 9 shows yet another alternative embodiment of the present invention wherein the charge separation layer 39 is made of a material having a narrow band-gap energy level (i.e., the conduction band energy level is close to the valence band energy level). The narrow band-gap property of the charge separation layer allows for excitation of additional electrons 90 from the underlying semiconductor material (as in a conventional Schottky diode solar cell). The internal emission supplements the photoexcitation of the photosensitizer layer 10 and thereby produces additional energy.

Figure 10:
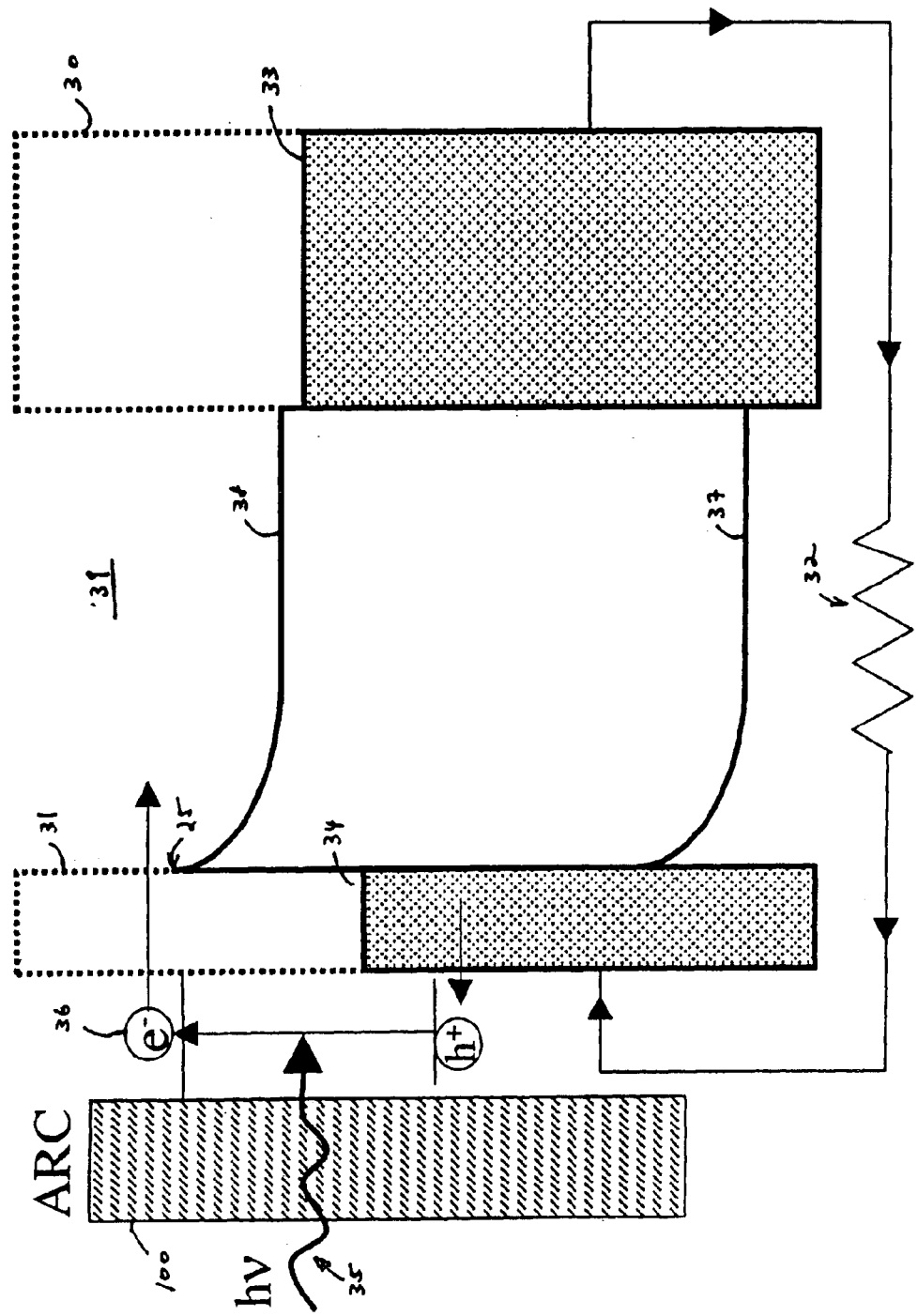
FIG. 10 is an illustration of the present invention in accordance with yet another alternative embodiment.

FIG. 10 shows yet another alternative embodiment of the present invention wherein an anti-reflection coating (ARC) layer 100 is added to the photosensitizer layer so as to increase the absorbency of the photosensitizer layer and reduce the reflection of incident light by keeping the photons within the structures. The detailed design of these coatings is well-established technology.

Figure 11:
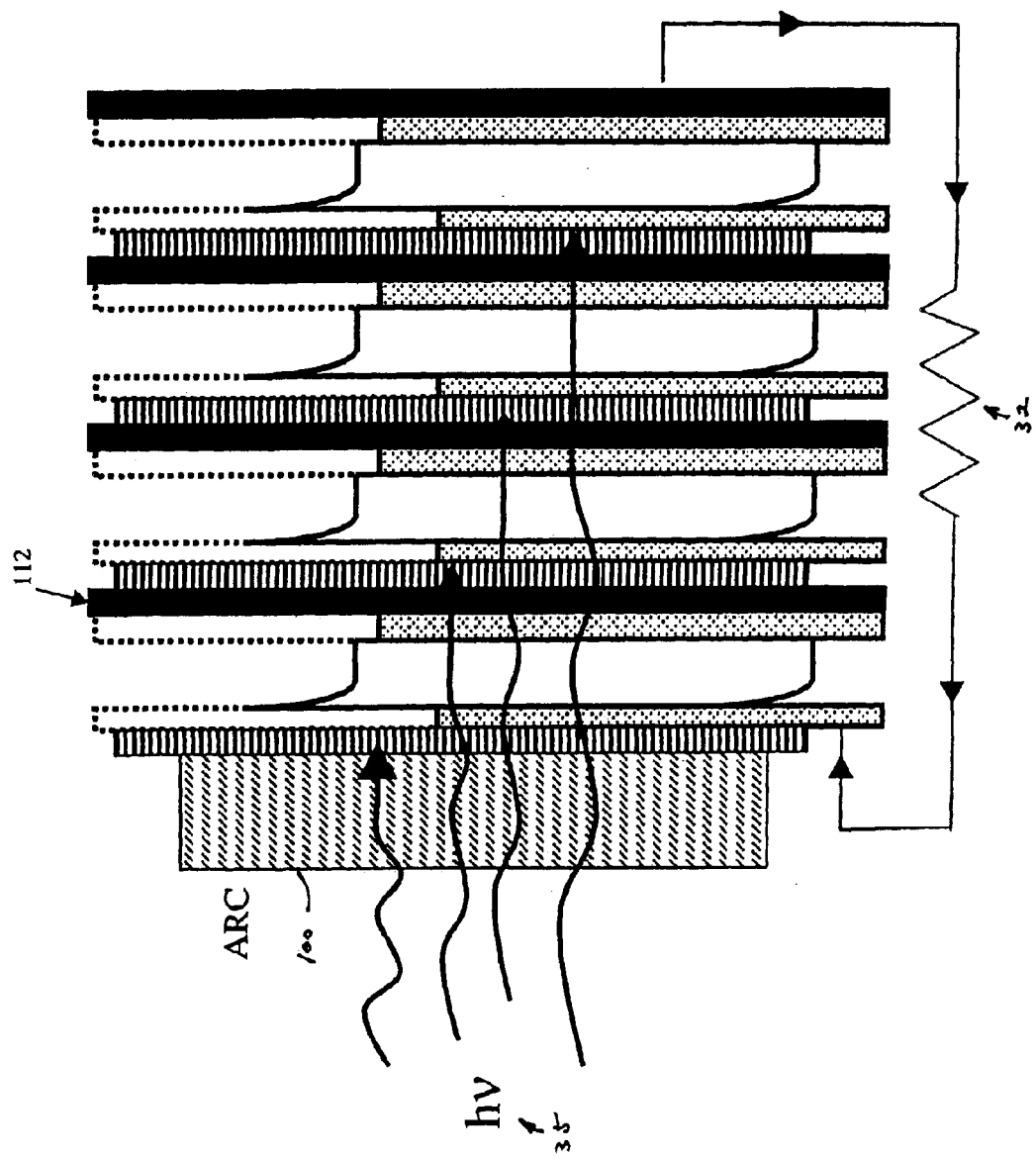
FIG. 11 is an illustration of the present invention in accordance with yet another alternative embodiment.

FIG. 11 shows a multilayer structure wherein multiple structures of the preferred embodiment as shown in FIG. 3 is deposited in a parallel fashion, separated by transparent spacer 112, to produce a superstructure that provides increased absorbency and efficiency in producing photovoltaic energy. Although FIG. 11 shows a parallel combination of the preferred embodiment, it should be noted that a serial combination is also possible and feasible.

Figure 12:
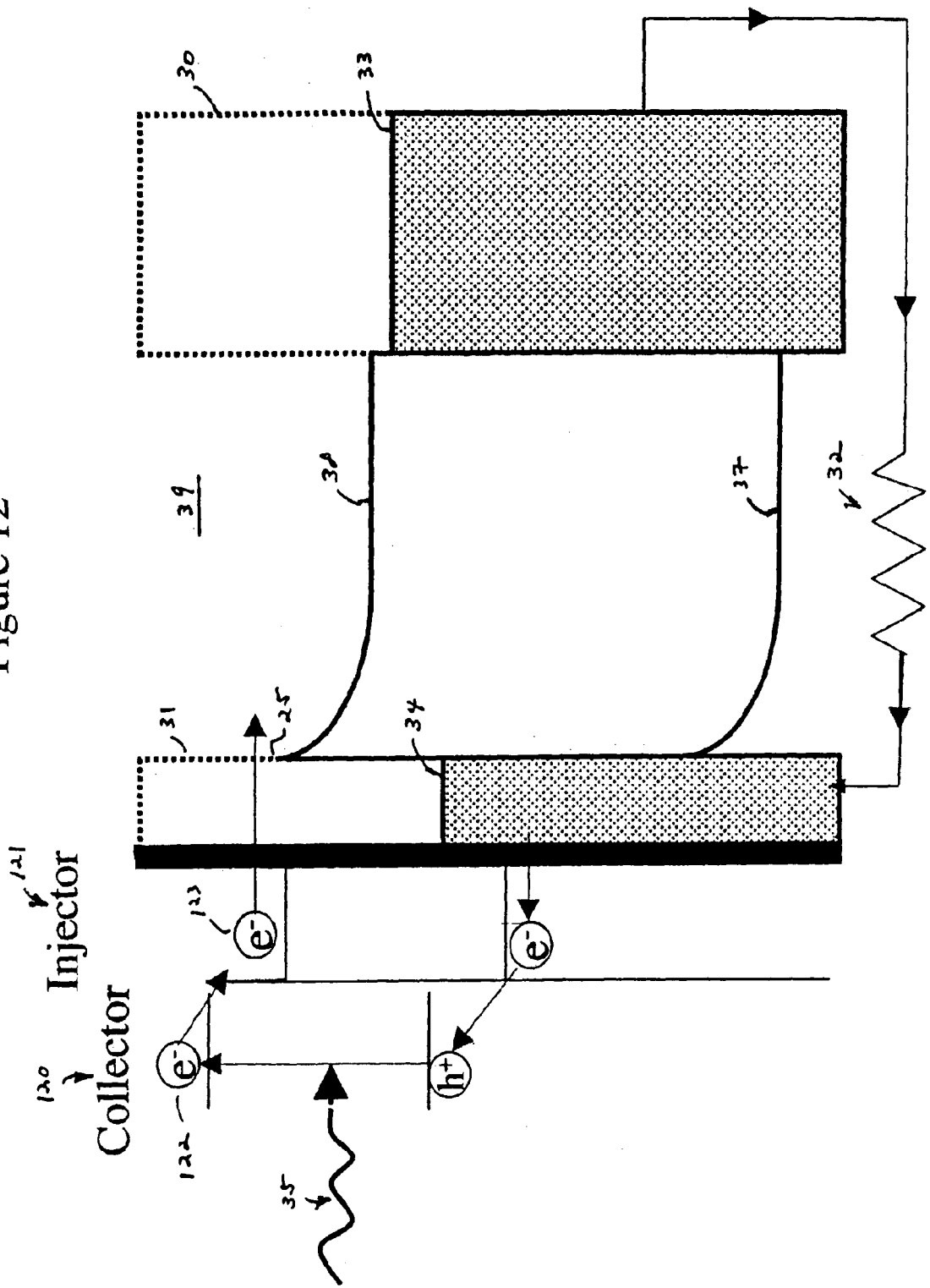
FIG. 12 is an illustration of the present invention in accordance with yet another alternative embodiment.

FIG. 12 shows an alternative embodiment where the absorption of photo energy and injection of electrons may be performed with different molecules or structures. More specifically, the photons are absorbed in one or more photoactive molecules or structures 120 and relay their charge carriers 122 to a second layer or structure 121 with more efficient injection properties. This mimics natural photosynthetic processes whereby multiple pigments are used to more efficiently capture sunlight and relay the excited charges to common collectors for further transport.

Figure 13:
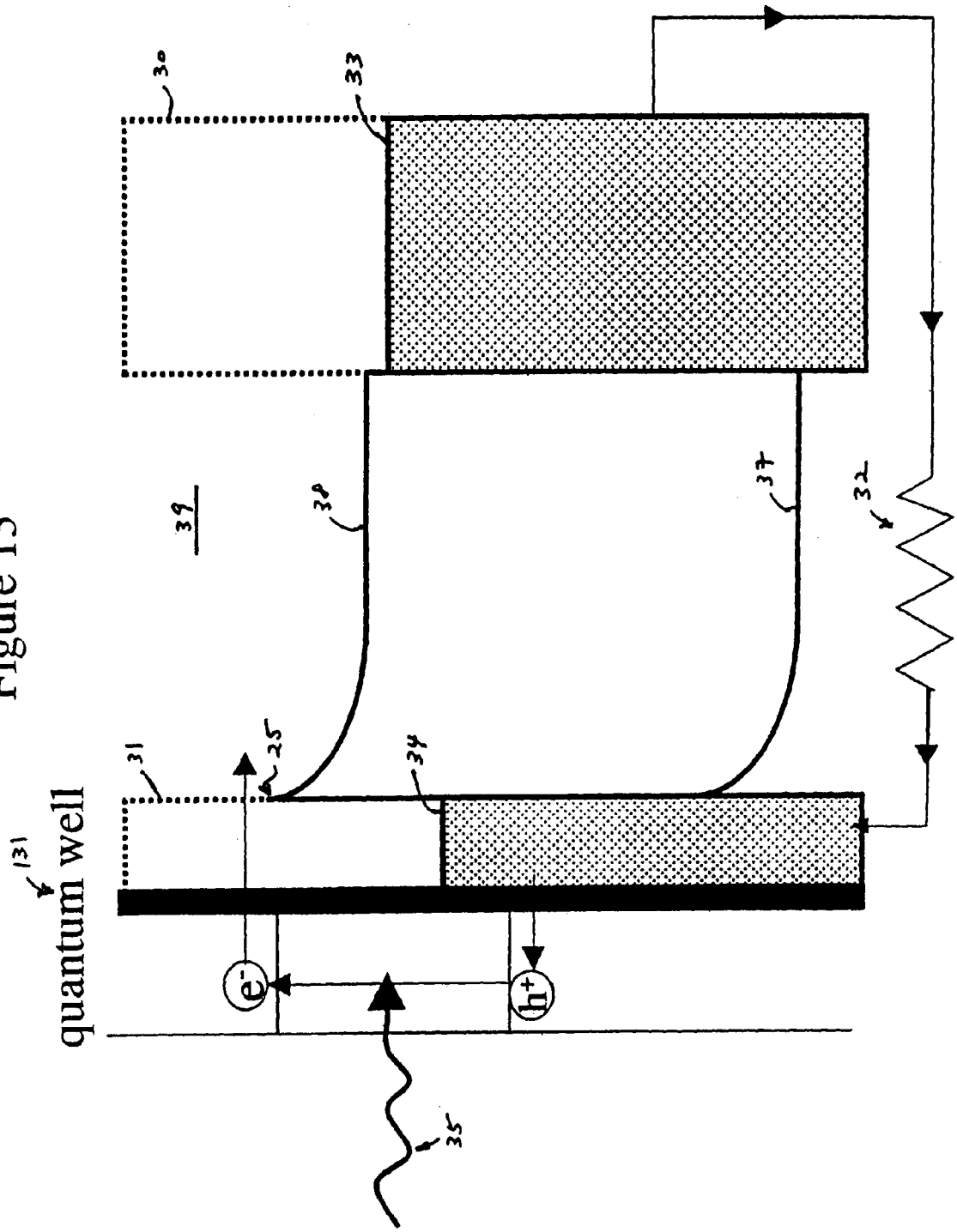
FIG. 13 is an illustration of the present invention in accordance with yet another alternative embodiment.

FIG. 13 shows an alternative embodiment where absorption occurs in a quantum well 131 deposited on the surface. The dimensions of the quantum well and the properties of the material are chosen to optimally inject the charges.

FIG. 14 shows an embodiment where absorption occurs in structure or molecule partially isolated from the conductor to reduce coupling for optimal charge transfer. Examples include metal oxides, silicon dioxide, titanium dioxide, aluminum dioxide, organic chains and self-assembled monolayers deposited on the surface prior to the photoabsorber. For example, a thin layer of titanium dioxide (~1–5 nm) is deposited on the conductor (Au). The photoactive merbromin is applied and forms a covalent linkage through its active carboxylate moiety to the titanium (C—O—Ti).

As previously discussed, in fabricating a device in accordance with the preferred embodiment, a charge separation layer 39 of titanium dioxide is deposited onto titanium foil (the ohmic back contact 30). The charge separation layer 39 has a thickness ranging between 100 nm and 500 nm and is deposited by electron beam evaporation and/or by electroanodization of the titanium metal. Gold is then deposited to the composite layer to a thickness of 10 nm to form the ultra-thin conductor. The resulting current voltage curves of the Schottky contact are shown in FIG. 18. Also shown in FIG. 18 for comparison are devices using nickel instead of gold as the ultra-thin conducting layer 31. An approximately 0.8 eV barrier results.

In accordance with the alternative embodiment of FIG. 14, 2 nm of titanium dioxide is deposited onto the above-mentioned metal conductor 31 as a partial isolation layer. Photoactive merbromin is then applied and bonded covalently through its active carboxylate moiety to the titanium (C—O—Ti) to complete the active device.

Figure 15:
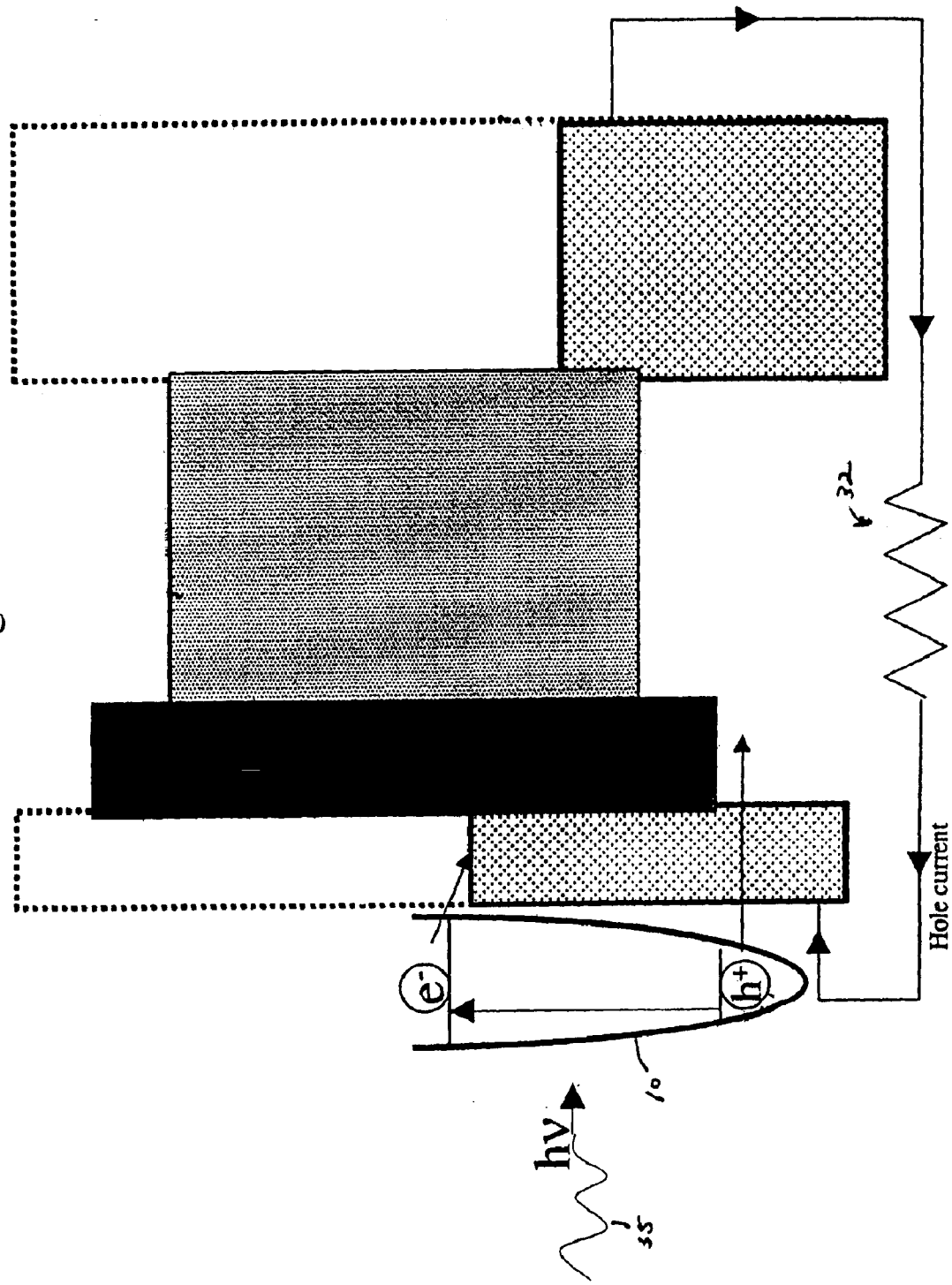
FIG. 15 is an illustration of the present invention in accordance with yet another alternative embodiment.

FIG. 15 shows an alternative embodiment comprising a polymer based device wherein a ballistic hole is injected into an ultra-thin hole carrier. Polymer A in FIG. 15, (e.g., poly(p-phenylene vinylene), PPV) with its highest occupied molecular orbital (HOMO) level lower in energy than the HOMO of a second polymer (B in FIG. 15) hole conductor layered behind it. The PPV provides a barrier to reverse hole transport serving the same role as the Schottky barrier. More traditional Schottky barrier devices have also been fabricated from polymer semiconductors and would be configured as in the above embodiments.

Although preferred embodiments of the invention are illustrated in the drawings and described in the detailed description, it will be understood that the invention is not limited to the embodiments disclosed, but is capable of numerous modifications and rearrangements of parts and elements without departing from the spirit of the invention.

I claim:

1. A multilayer solid-state device for producing electrical power from light comprising:

a light energy conversion layer;

a two-sided conducting layer having the light energy conversion layer secured to a first side thereof;

a charge separation layer secured to a second side of the conducting layer; and the conducting layer ballistically transports charge carriers from the light energy conversion layer to the charge separation layer which eliminates the need for an electrolyte when producing electrical power from light that impinges upon the light energy conversion layer;

wherein the conducting layer and the charge separation layer define a metal-insulator-semiconductor junction.

2. A multi-layer solid-state device for producing electrical power from light comprising:

a light energy conversion layer containing photosensitive means;

an ultra-thin, two sided, electrically conducting front contact layer having the light energy conversion layer secured to a first side thereof;

a two sided semiconductor charge separation layer having one side thereof secured to the second side of the front contact layer;

the front contact layer ballistically transports electrical energy from the light energy conversion layer to the charge separation layer which eliminates the need for an electrolyte when producing electrical power from light that impinges upon the light energy conversion layer; and an electrically conductive metal back contact secured to the second side of the charge separation layer;

wherein the front contact layer and the semiconductor charge separation layer define a metal-insulator-semiconductor junction which maximizes output power.

* * * * *

UNITED STATES PATENT AND TRADEMARK OFFICE
CERTIFICATE OF CORRECTION

PATENT NO. : 6,956,163 B2
DATED : October 18, 2005
INVENTOR(S) : Eric W. McFarland It is certified that error appears in the above-identified patent and that said Letters Patent is hereby corrected as shown below:

Column 3,
Line 3, replace "583-5851" with -- 583-585 --.
Line 38, replace "inter alia" with -- *inter alia* --.

Column 4,
Line 50, replace "use components" with -- use reactive components --.
Line 60, replace "dyesensitized" with -- dye-sensitized --.

Signed and Sealed this

Seventeenth Day of January, 2006

JON W. DUDAS
*Director of the United States Patent and Trademark Office*